(12) United States Patent
Jeong et al.

(10) Patent No.: US 11,089,681 B2
(45) Date of Patent: Aug. 10, 2021

(54) INTERPOSER AND ELECTRONIC DEVICE INCLUDING THE SAME

(71) Applicant: Samsung Electronics Co., Ltd., Gyeonggi-do (KR)

(72) Inventors: Wooyoung Jeong, Gyeonggi-do (KR); Yongjin Woo, Gyeonggi-do (KR); Dongjun Kim, Gyeonggi-do (KR); Sungchang Jang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/930,589

(22) Filed: Jul. 16, 2020

(65) Prior Publication Data

US 2021/0029826 A1 Jan. 28, 2021

(30) Foreign Application Priority Data

Jul. 23, 2019 (KR) .................. 10-2019-0089052

(51) Int. Cl.
*H05K 1/11* (2006.01)
*H05K 1/18* (2006.01)
*H05K 1/14* (2006.01)

(52) U.S. Cl.
CPC ............ *H05K 1/115* (2013.01); *H05K 1/144* (2013.01); *H05K 1/181* (2013.01);
(Continued)

(58) Field of Classification Search
CPC ........ H05K 1/115; H05K 1/144; H05K 1/181; H05K 2201/2018; H05K 2201/09609; H05K 2201/047; H05K 2201/10378
(Continued)

(56) References Cited

U.S. PATENT DOCUMENTS 4,661,792 A * 4/1987 Watkins ................ H05K 1/145
336/192
10,342,131 B1 * 7/2019 Kim ..................... H05K 1/0222
(Continued)

FOREIGN PATENT DOCUMENTS

EP 2503861 A2 9/2012
KR 10-2019-0006166 A 1/2019
(Continued)

OTHER PUBLICATIONS

International Search Report dated Nov. 2, 2020.

*Primary Examiner* — Sherman Ng

(74) *Attorney, Agent, or Firm* — Cha & Reiter, LLC.

(57) ABSTRACT

According to an embodiment, an interposer structure comprises a top surface, a bottom surface facing away from the top surface; an inner sidewall extending from the top surface to the bottom surface, and forming an inner space accommodating one or more electronic components mounted on a circuit board of an electronic device; and an outer sidewall extending from the top surface to the bottom surface, and facing away from the inner sidewall, wherein the outer sidewall includes: a first area having a conductive member formed from the top surface to the bottom surface; and a second area having a conductive member formed from the top surface to a first position and a non-conductive member formed from the first position to the bottom surface.

18 Claims, 7 Drawing Sheets

(52) U.S. Cl.
CPC .............. *H05K 2201/047* (2013.01); *H05K 2201/09609* (2013.01); *H05K 2201/10378* (2013.01); *H05K 2201/2018* (2013.01)

(58) Field of Classification Search
USPC ........................................................ 361/803
See application file for complete search history.

(56) References Cited

U.S. PATENT DOCUMENTS

| | | | |
|---|---|---|---|
| 2005/0168961 A1* | 8/2005 | Ono ................ | H05K 1/144 361/784 |
| 2009/0268423 A1* | 10/2009 | Sakurai ............ | H05K 1/141 361/803 |
| 2011/0073355 A1* | 3/2011 | Tamura ............ | H01L 24/72 174/255 |
| 2011/0080718 A1* | 4/2011 | Koide .............. | H05K 3/4608 361/803 |
| 2012/0184116 A1 | 9/2012 | Pawlikowski et al. | |
| 2017/0358847 A1* | 12/2017 | Cho ................ | H05K 7/1427 |
| 2019/0082535 A1* | 3/2019 | Myers .............. | H05K 1/144 |
| 2019/0082536 A1* | 3/2019 | Park ................ | H01Q 1/526 |
| 2019/0191597 A1 | 6/2019 | Han et al. | |
| 2019/0267345 A1 | 8/2019 | Kabir et al. | |

FOREIGN PATENT DOCUMENTS

| | | |
|---|---|---|
| KR | 10-2019-0029215 A | 3/2019 |
| WO | 2018/139045 A1 | 8/2018 |

\* cited by examiner

INTERPOSER AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2019-0089052, filed on Jul. 23, 2019, in the Korean Intellectual Property Office, the disclosure of which is herein incorporated by reference in its entirety.

BACKGROUND

1) Field

The disclosure relates to an interposer disposed between circuit boards mounted in an electronic device.

2) Description of Related Art

An electronic device, such as a portable terminal, should be made smaller and multifunctional. To this end, the electronic device includes a circuit board on which various components are mounted. The circuit board may include a processor, memory, a camera, a broadcast reception module, a communication module, and the like required for an electronic device (e.g., a smartphone).

With the various components that are within the electronic device, it becomes important to prevent electromagnetic interference from deteriorating electronic signals.

The above information is presented as background information only to assist with an understanding of the disclosure. No determination has been made, and no assertion is made, as to whether any of the above might be applicable as prior art with regard to the disclosure.

SUMMARY

According to an embodiment, an interposer structure comprises a top surface, a bottom surface facing away from the top surface; an inner sidewall extending from the top surface to the bottom surface, and forming an inner space accommodating one or more electronic components mounted on a circuit board of an electronic device; and an outer sidewall extending from the top surface to the bottom surface, and facing away from the inner sidewall, wherein the outer sidewall includes: a first area having a conductive member formed from the top surface to the bottom surface; and a second area having a conductive member formed from the top surface to a first position and a non-conductive member formed from the first position to the bottom surface.

According to certain embodiments, an electronic device comprises a first circuit board (212) and a second circuit board (232) disposed inside the electronic device; one or more electronic components (213, 233) mounted on the first circuit board and one or more electronic components mounted on the second circuit board; and an interposer structure (250) disposed between the first circuit board and the second circuit board and surrounding the electronic components, wherein the interposer structure includes: a top surface (251) connected to the second circuit board; a bottom surface (252) facing away from the top surface, the bottom surface connected to the first circuit board; an inner sidewall 254 extending from the top surface to the bottom surface, and forming an inner space accommodating the electronic components; and an outer sidewall 253 extending from the top surface to the bottom surface, and facing away from the inner sidewall, wherein the outer sidewall includes: a first area (260) having a conductive member (257) formed from the top surface to the bottom surface; and a second area (270) having a conductive member formed from the top surface to a first position and a non-conductive member formed from the first position to the bottom surface.

According to certain embodiments disclosed herein, on a side surface of an interposer, it is possible to widen the area formed of a conductive member and to reduce the size of the area formed of a non-conductive member. Since the size of the area formed of the conductive member increases, it is possible to prevent deterioration of a signal transmitted through a conductive via in the interposer and to efficiently dispose the conductive via in the interposer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

An electronic device may include a plurality of circuit boards, and the circuit boards may be stacked in order to efficiently arrange the circuit boards. An interposer may be disposed between the stacked circuit boards, and the circuit boards and/or electronic components disposed on the circuit boards may be electrically connected through a plurality of conductive vias included in the interposer.

An electronic device including an interposer should minimize electromagnetic interference with a signal transmitted through a conductive via in order to prevent deterioration of the signal. In general, by placing a conductive member on the sidewall of the interposer for blocking electromagnetic waves, it is possible to suppress electromagnetic interference with a signal passing through the conductive via of the interposer.

Due to a bridge, which can be connected to the sidewall of an interposer (as a result of the manufacturing process of the interposer), there is an area in which a conductive member is not disposed in the sidewall of the interposer. As a result, a signal passing through a conductive via located adjacent to the sidewall may be exposed to electromagnetic interference.

According to an embodiment disclosed herein, it is possible to provide an interposer capable of preventing deterioration of a signal transmitted through the interposer.

Figure 1:
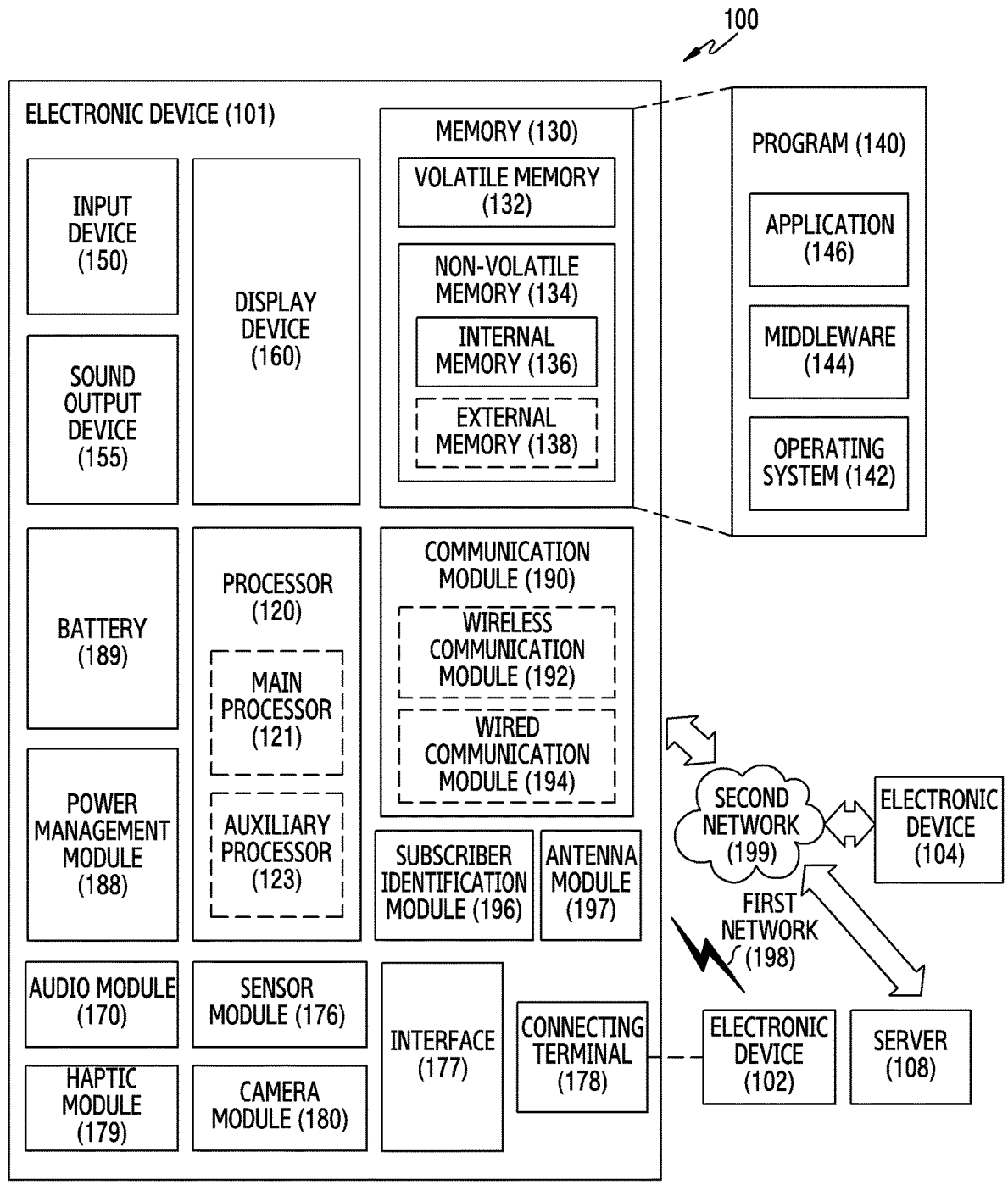
FIG. 1 is a block diagram of an electronic device according to certain embodiments in a network environment.

FIG. 1 describes an electronic device with a number of electronic components that may be placed on more than one circuit board. To keep the electronic device 101 small, the electronic components may be placed on more than one circuit board.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
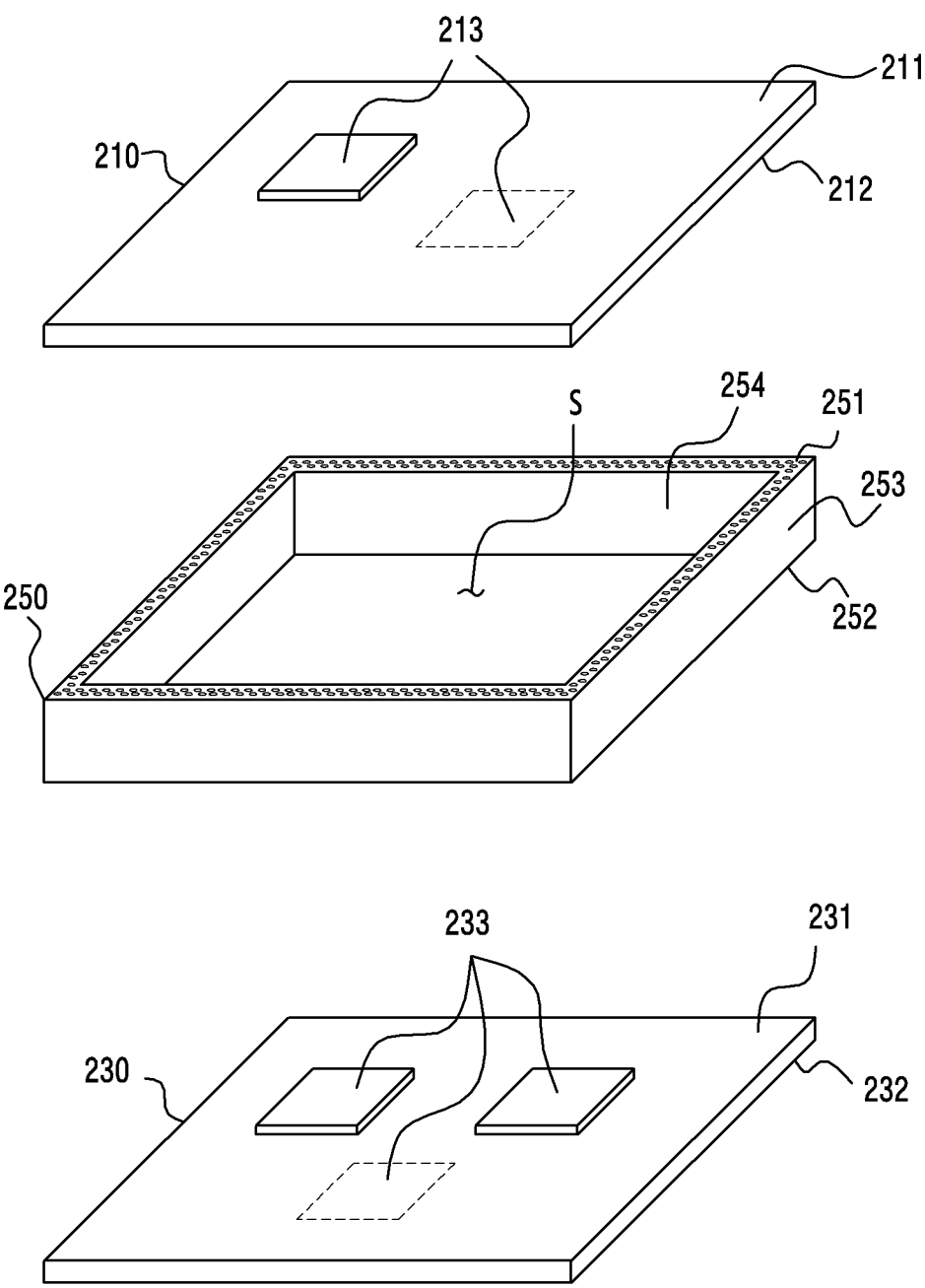
FIG. 2 is a view illustrating an interposer and circuit boards in an electronic device according to an embodiment.

As noted above, electronic components describe above can be disposed on more than one stack circuit board. Interposers may be stacked between the circuit boards. FIG. 2 shows two circuit boards separated by an interposer.

FIG. 2 illustrates an interposer and circuit boards of an electronic device (e.g., the electronic device 101 in FIG. 1) according to an embodiment. Referring to FIG. 2, an electronic device according to an embodiment may include a first circuit board 210, a second circuit board 230 disposed under the first circuit board 210, and an interposer 250 disposed between the first circuit board 210 and the second circuit board 230.

In an embodiment, the first circuit board 210 may be disposed on the top surface 251 of the interposer 250, and the second circuit board 230 may be disposed on the bottom surface 252 of the interposer 250. Each of the circuit boards 210 and 230 may include a plurality of electronic components 213 and 233. For example, a plurality of electronic components 213 and 233 may be mounted on the bottom surface 212 of the first circuit board 210 or the top surface 231 of the second circuit board 230. In this case, the electronic components 270 may be disposed in an inner space S formed by the interposer 250, the first circuit board 210, and the second circuit board 230.

The electronic components 213 are connected to the first circuit board 210 and electronic components 233 are connected to the second circuit board 233 by electrical contacts. The contact can include, among other things, a chip pin, and can be soldered to an electrical conductor, such as a printed circuit, disposed on the first circuit board 210. The contacts can signal contacts which receive and transmit signals, as well as power. Additionally, ground contacts can be used to establish a ground connection for the electronic component 233.

In an embodiment, the electronic components 213 and 233 mounted on the first circuit board 210 and the second circuit board 230 may include, but are not limited to, a processor, memory, a communication circuit, and a power management module required for the operation of the electronic device, to name a few. According to an embodiment, the processor (e.g., the processor 120 in FIG. 1) may include at least one of, for example, a central processing unit, an application processor (AP), a call processor (CP), a graphics processor, an image signal processor, a sensor hub processor, or a communication processor. The memory (e.g., the memory 130 in FIG. 1) may include, for example, volatile memory or nonvolatile memory. The communication circuit (e.g., the communication module 190 in FIG. 1) may include, for example, a wireless communication module (e.g., the wireless communication module 192 in FIG. 1) or a wired communication module (e.g., the wired communication module 194 in FIG. 1).

In an embodiment, the interposer 250 may be disposed between the first circuit board 210 and the second circuit board 230. The interposer 250 may include an inner sidewall 254 so as to form a space S therein when coupled to the first circuit board 210 and the second circuit board 230. The inner space S may be formed by the inner wall 254 of the interposer 250, the bottom surface 212 of the first circuit board 210, and the top surface 231 of the second circuit board 230. Although not illustrated, the interposer 250 may include a plurality of independent inner walls therein, and a plurality of inner spaces S may be formed by the inner walls, the bottom surface 212 of the first circuit board 210, and the top surface 231 of the second circuit board 230. However, the shape of the interposer 250 is not limited thereto, and may have various shapes.

The interposer 250 can carry signals between electronic components 213 and 233 on different circuit boards by establishing an electrical connection between signal contacts of the electronic components 213 and electronic components 233. In certain embodiments, the interposer 250 can include interposer pins which make an electrical contact with conductive material disposed on the first circuit board 210 which is electrically connected to signal pin(s) of electronic components 213, and forming an electrical contact with conductive material disposed on the second circuit board 230 which is electrical connected to a signal pin on electronic components 233.

The interposer 250 can also include interposer pins which make an electrical contact with conductive material disposed on the first circuit board 210 which is electrically connected to ground pin(s) of electronic component(s) 213, and forming an electrical contact with conductive material disposed on the second circuit board 230 which is electrical connected to ground pin(s) on electronic component(s) 233.

While the interposer 250 depicted in FIG. 2 has a rectangular shape, it is noted that the interposer 250 is not limited to rectangular. In another embodiment, the interposer 250 can be triangular, polygonal, or circular. In another embodiment, the interposer 250 can have a non-convex shape.

The interposer 250 includes conductive vias to allow communication between the first circuit board 210 and the second circuit board 230.

Figure 3A:
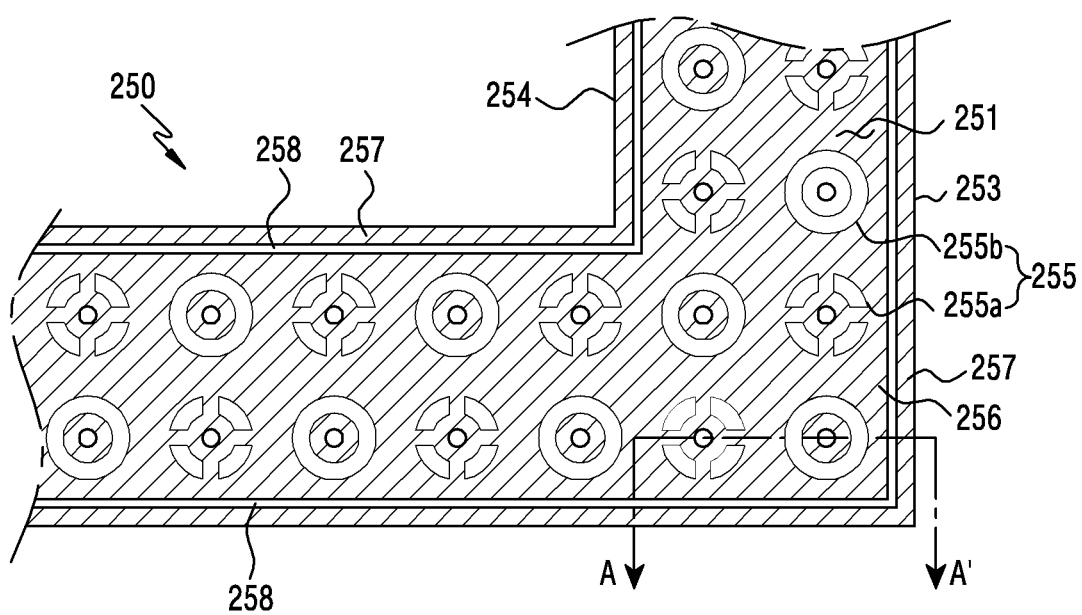
FIG. 3A is a view illustrating one surface of an interposer in an electronic device according to an embodiment.
Figure 3B:
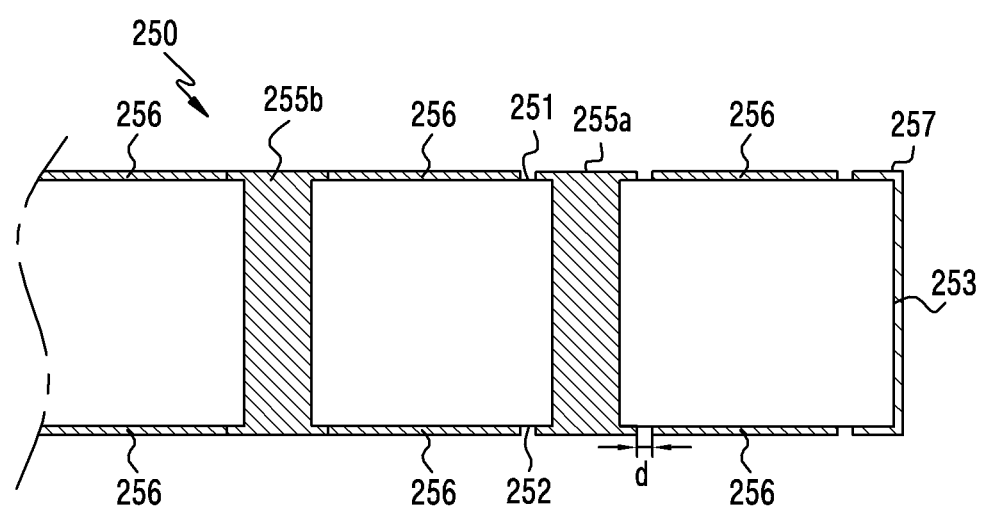
FIG. 3B is a cross-sectional view of the interposer in FIG. 3A taken along line A-A'.

FIG. 3A is a view illustrating one surface of an interposer in an electronic device according to an embodiment. FIG. 3B is a cross-sectional view of the interposer in FIG. 3A taken along line A-A'. Referring to FIGS. 3A and 3B, the interposer 250 may include interposer pins 255, a ground 256, and conductive members 257 penetrating the top surface 251 and the bottom surface 252 of the interposer 250.

In an embodiment, the interposer pins 255 may be conductive vias electrically connecting conductive pads disposed on the top surface 251 of the interposer 250 and conductive pads disposed on the bottom surface 252 of the interposer 250. An interposer pin 255 may be a signal pin 255a that transmits electrical signals generated from electronic components 213 and 233 mounted on the first circuit board 210 or the second circuit board 230. The signal pin 255a may be electrically disconnected by being spaced apart (d) from grounds 256 disposed on surfaces 251 and 252 of the interposer 250. An interposer pin 255 may be a ground pin 255b electrically connected to grounds 256 disposed on the surfaces 251 and 252 of the interposer 250. The interposer pins 255 are illustrated for convenience of description, and the size, number, and arrangement of the interposer pins 255 are not limited thereto.

In an embodiment, the electronic component 213 mounted on the first circuit board 210 may be electrically connected to the electronic component 233 mounted on the second circuit board 230 through an interposer pin 255. For example, a signal generated from the electronic component 213 mounted on the first circuit board 210 may be transmitted to the signal pin 255a through a conductive member disposed on the first circuit board 210, and the signal transmitted to the signal pin 255a may be transmitted to the electronic component 233 of the second circuit board 230 through a conductive member disposed on the second circuit board 230. Electrical signals as well as power may be transmitted through the interposer pins 255. For example, the power transmitted to the first circuit board 210 may be transmitted to the second circuit board 230 through the interposer pins 255, or the power transmitted to the second circuit board 230 may be transmitted to the first circuit board 210 through the interposer pins 255.

Meanwhile, the ground pin 255b may be disposed around the signal pin 255a to suppress electromagnetic interference of an electrical signal transmitted through the signal pin 255a. When the signal pin 255a for transmitting an electrical signal from an electronic component is disposed on the interposer 250, the interposer pin 255 in the vicinity of the signal pin 255a may be a ground pin 255b.

In certain embodiments, signal pin 255a can form an electrical connection to signal contacts of electrical component 213 and 233. The ground pin 255b can form an electrical connected to ground contacts of electrical components 213 and 233. Electrical connection shall be understood to mean substantially zero electrical resistance or impedance.

In an embodiment, the ground 256 may surround at least a portion of the interposer pin 255, or may be electrically connected directly to the interposer pin 255. The ground 256 may be formed of a copper foil and solder resist (SR) ink. The SR ink may be an ink applied in order to prevent corrosion of the copper foil. Meanwhile, keep-out areas 258 may be formed on the opposite sides of the ground 256. The keep-out areas 258 may be areas that are formed on the outer periphery of the interposer 250 such that a conductive member (e.g., a ground, a conductive via, or a wire) is not present therein.

In an embodiment, conductive members 257 may be disposed on the sidewalls 253 and 254 of the interposer 250. A conductive member 257 may be disposed on the outer sidewall 253 or the inner sidewall 254 of the interposer 250 to block electromagnetic waves radiated to the sidewall 253 or 254 of the interposer 250. For example, a conductive member 257 may block electromagnetic waves that are generated from electronic components (e.g., the electronic components 213 and 233 in FIG. 2) disposed in the inner space S of the interposer 250 and are radiated toward the inner sidewall 254 of the interposer 250. Further, a conductive member 257 may block electromagnetic waves that are generated from the outside of the interposer 250 and are introduced through the outer sidewall 253 of the interposer 250. According to an embodiment, the conductive members 257 may block the electromagnetic waves radiated to the sidewalls 253 and 254 of the interposer 250, thereby preventing deterioration of an electric signal passing through the interposer pin 255. According to an embodiment, the conductive members 257 may block radiation of electromagnetic waves generated from the interposer pins 255 to the outside of the interposer 250. The conductive members 257 may include a conductive material such as gold, copper, lead, or silver for blocking electromagnetic waves.

In an embodiment, the conductive members 257 disposed on the sidewalls 253 and 254 of the interposer 250 may extend to a portion of the keep-out area 258 on the top or bottom surface of the interposer 250. For example, when viewed from the outer sidewall 253 of the interposer 250, the conductive member 257 may have a "U" shape surrounding the outer sidewall 253 of the interposer 250, a portion of the top surface 251 of the interposer 250, and a portion of the bottom surface 252 of the interposer 250.

In an embodiment, the conductive members 257 may be integrated with the grounds 256 by being electrically connected to the grounds 256 disposed on the surfaces 251 and 252 of the interposer 250. In another embodiment, the conductive members 257 may be electrically connected to the ground pins 255b so as to be integrated with the grounds 256.

To prevent electromagnetic interference, a sidewall, either inner sidewall 254 or outer sidewall 253 can have an area that is formed of a conductive member from the top surface 250 to a point between the top surface and the bottom surface. The area can be formed of non-conductive material or a non-conductive member from the point to the bottom surface. In the pins 255 in the area can be signal pins 255a.

Figure 4:
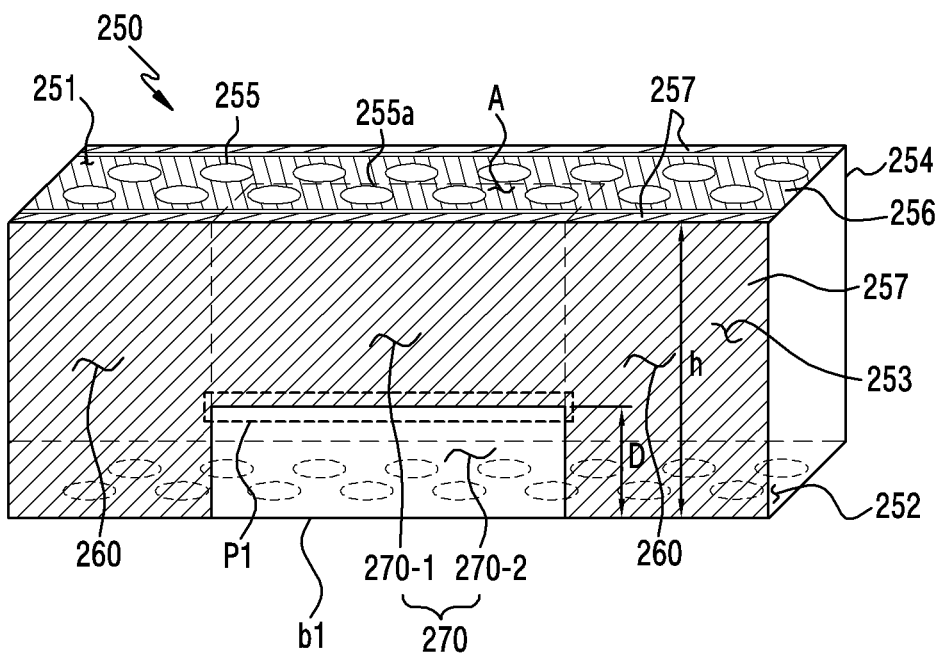
FIG. 4 is a view illustrating conductive members disposed on the sidewalls of an interposer in an electronic device according to an embodiment.

FIG. 4 is a view illustrating conductive members disposed on the sidewalls of an interposer in an electronic device according to an embodiment. Referring to FIG. 4, the sidewalls 253 and 254 of the interposer 250 according to an embodiment may include first areas 260, which are entirely formed of, covered by, or coated by a conductive member 257 (now collectively referred to as "formed of"), and a second area 270, a portion of which is formed of a conductive member 257. For example, the outer sidewall 253 of the interposer 250 may include first areas 260 in which the portion from the top surface 251 to the bottom surface 252 of the interposer 250 is formed of a conductive member 257, and a second area 270 in which the portion from the top surface 251 of the interposer 250 to a first position p1 is formed of a conductive member 257 and the portion from the first position p1 to the bottom surface 252 is formed of a non-conductive member. The second area 270 may include an area 270-1 formed of a conductive member 257 and an area 270-2 formed of a non-conductive member. According to an embodiment, the first areas 260 may exist on each side of the second area 270. In this case, the area 270-2 formed of the non-conductive member in the second area 270 may be surrounded by the areas formed of the conductive member 257. That is, the area 270-2 may be surrounded by the area 270-1 and the first areas 260.

In an embodiment, the first position p1, which defines the boundary between the area 270-1 formed of the conductive member 257 and the area 270-2 formed of the non-conductive member, is not limited to the illustrated shape, and may have any of various shapes. For example, in the second area, the boundary between the area 270-1 formed of the conductive member and the area 270-2 formed of the non-conductive member may be linear, at an incline, decline, or curved.

According to an embodiment, when viewed from the outside of the interposer 250, since the conductive member 257 is disposed in the first area 260, it may be seen that the first area 260 may be considered to be formed of the conductive member 257, and since the conductive member 257 is not disposed in a portion of the second area 270 and the outer sidewall 253 of the interposer 250 is exposed, it may be seen that a portion of the second area 270 is formed of the conductive member 257 and a portion of the second area 270 is formed of the non-conductive member. According to an embodiment, the outer sidewall 253 of the interposer 250 may include areas 260 and 270-1 where the conductive member 257 is disposed and areas 270-2 where the conductive member 257 is not disposed. In other words, the wording "the sidewall 253 or 254 of the interposer 250 is formed of a conductive member 257" may mean that a conductive member 257 is disposed on the sidewall 253 or 254 of the interposer 250, and the wording "the sidewall 253 or 254 is formed of a non-conductive member" may mean that a conductive member 257 is not disposed on the sidewall 253 or 254 of the interposer 250.

According to an embodiment, the area 270-2 formed of a non-conductive member in the outer sidewall 253 of the interposer 250 may be spaced apart from the top surface 251 of the interposer 250. For example, a first boundary b1 of the area 270-2 is in contact with the bottom surface 252 of the interposer 250, and the boundary other than the first boundary b1 may be in contact with the first area 260 and the area 270-1. According to an embodiment, the area 270-2 may extend by D from a portion b1 of the boundary between the outer sidewall 253 and the bottom surface 252 of the interposer 250. According to an embodiment, since the area 270-2 is spaced apart from the top surface, the height D of the area 270-2 may be smaller than the height h of the interposer 250.

According to an embodiment, the conductive member 257 may be disposed on each of the sidewalls 253 and 254 of the interposer 250, and the conductive member 257 may include an open area. For example, the conductive member 257 disposed on the outer sidewall of the interposer may include an open area in the area corresponding to the area 270-2. The area 270-2 of the outer sidewall 253 of the interposer 250 may be exposed to the surface of the interposer 250 through the open area of the conductive member 257.

According to an embodiment, the interposer pins 255 disposed in a region A adjacent to the area 270-2 may be signal pins 255a. When there is an area (not illustrated) formed of a non-conductive member from the top surface to the bottom surface of the interposer in a conventional interposer, electromagnetic interference to the interposer pins may be caused by electromagnetic waves radiated to the corresponding area. According to an embodiment, even if there is a portion formed of a non-conductive member (e.g., the area 270-2) on the sidewalls 253 and 254 of the interposer 250, an area from a portion of the boundary (e.g., the first position P1) of the non-conductive area to one surface (e.g., the top surface 251) of the interposer 250 may be formed of the conductive member 257. For example, although the area 270-2 formed of a non-conductive member exists in the second area 270 of the outer sidewall 253 of the interposer 250, the area 270-2 may only cover the interposer 250 from the position p1 to the bottom surface 252, and the interposer 250 may have a conductive member 257 formed from the first position p1 to the top surface 251. According to an embodiment, since the area 270-1 in the second area 270 is formed of a conductive member 257, an interposer pin 255 disposed in an area A adjacent (or directly above) to the area formed of a non-conductive member in the outer sidewall 253 of the interposer 250 may also be a signal pin 255a. According to an embodiment, the second area 270 including the area 270-2 formed of a non-conductive member may include an area 270-1 formed of a conductive member 257, and the conductive member 257 disposed in the area 270-1 may prevent electromagnetic interference to the signal pin 255a disposed in the area A adjacent to the area 270-2.

Although FIG. 4 illustrates the outer sidewall 253 of the interposer, the above-described embodiments may also be similarly applied to the inner sidewall 254 of the interposer. According to an embodiment, an area formed of a non-conductive member on the outer sidewall of the interposer and an area formed of a non-conductive member on the inner sidewall of the interposer may overlap each other. For example, an area corresponding to the area 270-2 existing on the outer sidewall 253 and formed of a non-conductive member may exist in the inner sidewall 254 of the interposer 250.

Figure 5:
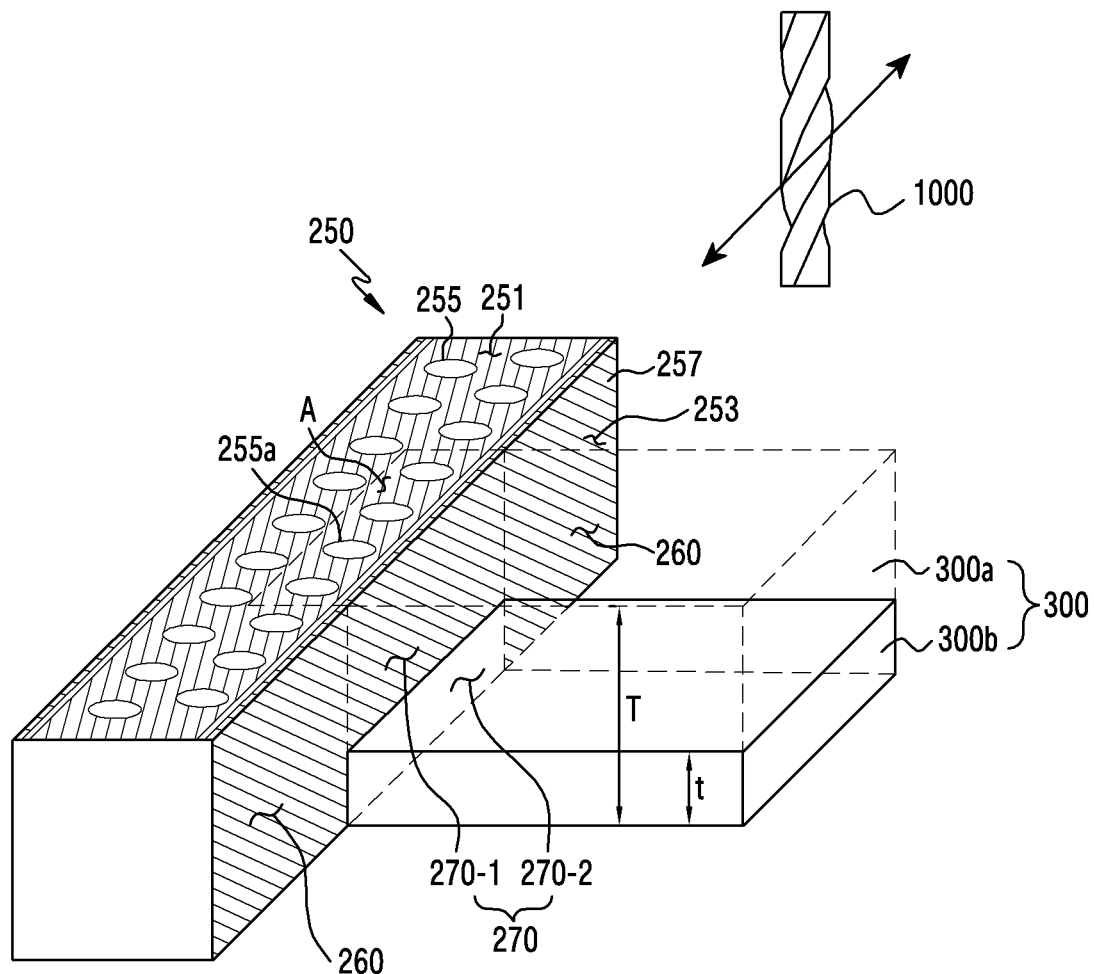
FIG. 5 is a view illustrating a method of manufacturing an interposer in an electronic device according to an embodiment.

FIG. 5 is a view illustrating a method of manufacturing an interposer in an electronic device according to an embodiment. During manufacture of the interposer 250, a bridge 300 may be previously connected to sidewall 253. Part of the bridge 300a can be removed, thus resulting in the part of bridge 300b only obscuring area P1. At this point, the conductive member 257 can be applied to 253. Since the bridge 300 obscures area P1, area P1 does not receive the conductive member 257.

Referring to FIG. 5, an interposer 250 may include a bridge 300 connected to sidewalls 253 and 254 of the interposer 250 during a manufacturing process. The bridge 300 is a structure that stably supports the interposer 250 in the process of manufacturing the interposer 250 by connecting the interposer 250 to another structure. The bridge 300 is a configuration that is used in the process of manufacturing the interposer 250, and may be finally removed from the interposer 250.

According to an embodiment, the bridge 300 may be connected to the entire second area 270 at the initial stage in the process of manufacturing the interposer 250, and a portion 300a of the bridge 300, connected to the area, and a portion 300b of the bridge 300, connected to the area 270-2, may be sequentially removed in the process of manufacturing the interposer 250. According to an embodiment, before the conductive member 257 is disposed on the outer sidewall 253 of the interposer 250, the portion 300a of the bridge 300, existing in the second region 270, may be removed using a depth drill 1000. For example, the portion 300a of the bridge 300 that is connected to the first area 270-1 may be removed before the conductive member 257 is disposed on the outer sidewall 253 of the interposer 250, and the portion 300b of the bridge 300 that is connected to the second area 270-2 may be removed after the conductive member 257 is disposed on the outer sidewall 253 of the interposer 250. When the thickness of the bridge 300 connected to the outer sidewall 253 of the interposer 250 is reduced by the depth drill 1000 before the conductive member 257 is disposed on the outer sidewall 253 of the interposer 250, the conductive member 257 may be disposed on the area 270-1, which is a portion of the second area 270 of the outer sidewall 253 of the interposer 250. When the conductive member 257 is disposed on the outer sidewall 253 of the interposer 250, the area 270-1 of the second area 270 is exposed to the outside. Thus, the conductive member 257 may be disposed on the area 270-1, and thus the area 2701 may be formed of the conductive member 257. Meanwhile, since the area 270-2 of the interposer 250 is not exposed to the outside when the conductive member 257 is disposed on the outer sidewall 253 of the interposer 250, no conductive member 257 may be disposed in the area 270-2 of the interposer 250 according to an embodiment. Accordingly, the area 270-2 of the interposer 250 may be formed of a non-conductive member.

According to an embodiment, the conductive member 257 may also be disposed on a portion 270-1 of the second area 270, which is a portion of the outer sidewall 253 of the interposer 250 to which the bridge 300 was connected. Therefore, electromagnetic interference to a signal pin 255a disposed in an area 270-3 adjacent to the second area 270 can be suppressed. According to an embodiment, in view of suppression of electromagnetic interference to the signal pin 255a, it may be advantageous for the bridge 300 to be cut a lot before the conductive member 257 is disposed on the outer sidewall 253 of the interposer 250. This is because, as the cut amount of the bridge 300 connected to the interposer 250 increases, the area 270-1 in which the conductive member 257 can be disposed increases, and as the area of the conductive member 257 increases, the effect of blocking electromagnetic waves on the interposer pins 255 disposed in the area A adjacent to the second area 270 increases. In other words, as the area of the area 270-2 of the second area 270 decreases, the performance of blocking electromagnetic waves of the interposer 250 can be improved. However, the portion 300b of the bridge 300 remaining in the area 270-2 should stably support the interposer 250 in the subsequent process of manufacturing the interposer 250 including the process of arranging the conductive member 257. Thus, the amount of the portion 300a of the bridge 300 that is capable of being removed by the depth drill 1000 before the conductive member 257 is disposed is limited. That is, for stability in the process of manufacturing the interposer 250, after the portion 300a of the bridge 300 that is connected to the area 270-1 is removed using the depth drill 1000, the thickness t of the portion 300b of the bridge 300 that is connected to the area 270-2 should be equal to or greater than a predetermined size. According to an embodiment, the thickness t of the remaining portion 300b of the bridge 300 may be about 0.4 times the thickness T of the interposer 250.

In another method, an interposer 250 can have the entire bridge 300 removed and be placed on top of an interposer 250 with a bridge 300. The conductive member 257 can be applied to sidewall 253. Since bridge 300 obscures a portion of the sidewall 253, the portion does not receive the conductive member 257.

Figure 6:
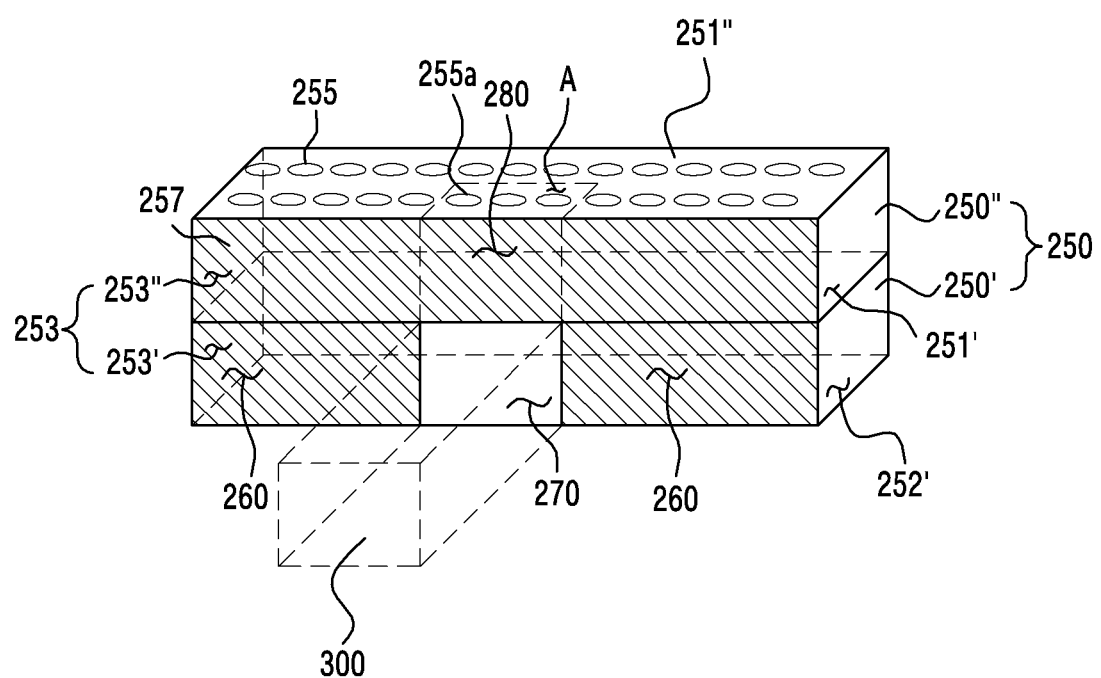
FIG. 6 is a view illustrating a method of manufacturing an interposer in an electronic device according to an embodiment.

FIG. 6 is a view illustrating a method of manufacturing an interposer in an electronic device according to an embodiment. According to an embodiment, even without a depth drill step, an interposer pin 255 disposed in an area A adjacent to an area formed of a non-conductive member in the interposer may be a signal pin 255a.

According to an embodiment, the interposer 250 may be formed by integrating a first interposer 250' and a second interposer 250". According to an embodiment, the outer sidewall 253' of the first interposer 250' may include a first area 260 formed of a conductive member 257 and a second area 270 formed of a non-conductive member. The first area 260 of the first interposer 250' may be an area formed of a conductive member 257 from the top surface 251' to the bottom surface 252' of the first interposer 250', and the second area 270 may be an area formed of a non-conductive member from the top surface 251' to the bottom surface 252'. According to an embodiment, since a conductive member 257 is disposed on the first area 260 of the first interposer 250', the first area 260 of the interposer 250 may be the area formed of a conductive member 257, and since a conductive member 257 is not disposed on the second area 270, the second area 270 of the interposer 250 may be an area formed of a non-conductive member.

According to an embodiment, the sidewall of the second interposer 250" corresponding to the first interposer 250' may be formed of a conductive member 257. According to an embodiment, in the outer sidewall 253" of the second interposer 250", at least a third area 280 corresponding to the second area 270 of the first interposer 250' may be formed of a conductive member 257.

Referring to FIG. 6, the second area 270 of the first interposer 250' may be a portion connected to the bridge 300 in the process of manufacturing the interposer 250. The bridge 300 may be removed after the conductive member 257 is disposed on the outer sidewall 253 of the interposer 250. When the conductive member 257 is disposed on the outer sidewall 253 of the interposer 250, the second area 270 is not exposed to the outside. Thus, the conductive member 257 may not be disposed on the second area 270. Since the conductive member 257 is not disposed on the second area 270, the second area 270 of the interposer 250 may be formed of a non-conductive member.

According to an embodiment, even if the second area 270 is formed of a non-conductive member, the outer sidewall 253" of the second interposer 250" corresponding to the second area 270 is formed of the conductive member 257. Thus, a signal pin 255a may be disposed in the area A adjacent to the second area 270. Since the conductive member 257 disposed in the third area 280 is capable of blocking some of electromagnetic waves radiated to an area 270 or 280 corresponding to the second area 270 in the outer sidewall of the interposer 250, it is possible to prevent deterioration of a signal on the signal pin 255a adjacent to the second area 270.

According to an embodiment, an interposer structure comprises a top surface (251), a bottom surface (252) facing away from the top surface; an inner sidewall (254) extending from the top surface to the bottom surface, and forming an inner space accommodating one or more electronic components (213, 233) mounted on a circuit board of an electronic device; and an outer sidewall (253) extending from the top surface to the bottom surface, and facing away from the inner sidewall, wherein the outer sidewall includes: a first area (260) having a conductive member formed from the top surface to the bottom surface; and a second area (270) having a conductive member formed from the top surface to a first position and a non-conductive member formed from the first position to the bottom surface.

In certain embodiments, the interposer further comprises a plurality of conductive vias (255) penetrating the interposer from the top surface to the bottom surface, wherein the plurality of conductive vias include a first conductive (255b) via disposed at a position corresponding to the first area and a second conductive via (255a) corresponding to the second area.

In certain embodiments, the interposer structure is connected to a first circuit board 212.

In certain embodiments, the first conductive via is electrically connected to a ground contact of an electrical component 213 disposed on the first circuit board 212.

In certain embodiments, the second conductive via is electrically connected to a signal contact of an electrical component disposed on the first circuit board.

In certain embodiments, the second conductive via is disposed closer to the outer sidewall than the inner sidewall at a position corresponding to the second area.

In certain embodiments, the first position is spaced apart from each of the top surface and the bottom surface.

In certain embodiments, a ratio of the distance from the bottom surface to the first position to a distance between the top surface and the bottom surface is between 0.5 and 1.

In certain embodiments, the inner sidewall includes: a third area having a conductive member formed from the top surface to the bottom surface; and a fourth area having a conductive member formed from the top surface to a second position and a non-conductive member formed from the second position to the bottom surface.

In certain embodiments, the second position is spaced apart from each of the top surface and the bottom surface.

In certain embodiments, a ratio of a distance from the bottom surface to the second position to a distance between the top surface and the bottom surface is greater than 0.5 and smaller than 1.

In certain embodiments, an electronic device comprises a first circuit board (212) and a second circuit board (232) disposed inside the electronic device; one or more electronic components (213, 233) mounted on the first circuit board and one or more electronic components mounted on the second circuit board; and an interposer structure (250) disposed between the first circuit board and the second circuit board and surrounding the electronic components, wherein the interposer structure includes: a top surface (251) connected to the second circuit board; a bottom surface (252) facing away from the top surface, the bottom surface connected to the first circuit board; an inner sidewall 254 extending from the top surface to the bottom surface, and forming an inner space accommodating the electronic components; and an outer sidewall 253 extending from the top surface to the bottom surface, and facing away from the inner sidewall, wherein the outer sidewall includes: a first area (260) having a conductive member (257) formed from the top surface to the bottom surface; and a second area (270) having a conductive member formed from the top surface to a first position and a non-conductive member formed from the first position to the bottom surface.

In certain embodiments, the interposer structure further includes a plurality of conductive vias penetrating the interposer from the top surface to the bottom surface, and the plurality of conductive vias include a first conductive via disposed at a position corresponding to the first area and a second conductive via corresponding to the second area.

In certain embodiments, the second conductive via is electrically connected to a signal contact one of the one or more electronic components mounted on the first circuit board and electrically connected to a signal contact on the second circuit board, and disposed to closer to the outer sidewall than the inner sidewall at a position corresponding to the second area.

In certain embodiments, the first position is spaced apart from each of the top surface and the bottom surface.

In certain embodiments, a ratio of a distance from the bottom surface to the first position to a distance between the top surface and the bottom surface is between 0.5 and 1.

In certain embodiments, the inner sidewall includes a third area having a conductive member formed from the top surface to the bottom surface; and a fourth area having a conductive member formed from the top surface to a second position and a non-conductive member formed from the second position to the bottom surface.

In certain embodiments, a ratio of a distance from the bottom surface to the second position to a distance between the top surface and the bottom surface is greater than 0.5 and smaller than 1.

In certain embodiments, the one or more electronic components mounted on the first circuit board and the one or more electronic components mounted on the second circuit board include at least one of a processor, memory, or a communication circuit.

In certain embodiments, the first conductive via is electrically connected to a ground contact one of the one or more electronic components mounted on the first circuit board and electrically connected to a ground contact on the second circuit board.

The various example embodiments disclosed herein and illustrated in the drawings are provided by way of illustration and are not intended to limit the scope of the present disclosure. Therefore, all changes or modifications derived from the technical idea of the present disclosure as well as the embodiments described herein should be understood to fall within the scope of the present disclosure.

What is claimed is:

1. An interposer structure comprising:
a top surface;
a bottom surface facing away from the top surface;
an inner sidewall extending from the top surface to the bottom surface, and forming an inner space accommodating one or more electronic components mounted on a circuit board of an electronic device; and
an outer sidewall extending from the top surface to the bottom surface, and facing away from the inner sidewall,
wherein the outer sidewall includes:
a first area having a conductive member formed from the top surface to the bottom surface; and
a second area having a conductive member formed from the top surface to a first position and a non-conductive member formed from the first position to the bottom surface, and
wherein the inner sidewall includes:
a third area having a conductive member formed from the top surface to the bottom surface; and
a fourth area having a conductive member formed from the top surface to a second position and a non-conductive member formed from the second position to the bottom surface.

2. The interposer structure of claim 1, further comprising:
a plurality of conductive vias penetrating the interposer from the top surface to the bottom surface,
wherein the plurality of conductive vias include a first conductive via disposed at a position corresponding to the first area and a second conductive via corresponding to the second area.

3. The interposer structure of claim 2, wherein the interposer structure is connected to a first circuit board.

4. The interposer structure of claim 3, wherein the first conductive via is electrically connected to a ground contact of an electrical component disposed on the first circuit board.

5. The interposer structure of claim 3, wherein the second conductive via is electrically connected to a signal contact of an electrical component disposed on the first circuit board.

6. The interposer structure of claim 5, wherein the second conductive via is disposed closer to the outer sidewall than the inner sidewall at a position corresponding to the second area.

7. The interposer structure of claim 1, wherein the first position is spaced apart from each of the top surface and the bottom surface.

8. The interposer structure of claim 7, wherein a ratio of a distance from the bottom surface to the first position to a distance between the top surface and the bottom surface is between 0.5 and 1.

9. The interposer structure of claim 1, wherein the second position is spaced apart from each of the top surface and the bottom surface.

10. The interposer structure of claim 9, wherein a ratio of a distance from the bottom surface to the second position to a distance between the top surface and the bottom surface is greater than 0.5 and smaller than 1.

11. An electronic device comprising:
a first circuit board and a second circuit board disposed inside the electronic device;
one or more electronic components mounted on the first circuit board and one or more electronic components mounted on the second circuit board; and
an interposer structure disposed between the first circuit board and the second circuit board and surrounding the electronic components,
wherein the interposer structure includes:
a top surface connected to the second circuit board;
a bottom surface facing away from the top surface, the bottom surface connected to the first circuit board;
an inner sidewall extending from the top surface to the bottom surface, and forming an inner space accommodating the electronic components; and
an outer sidewall extending from the top surface to the bottom surface, and facing away from the inner sidewall,
wherein the outer sidewall includes:
a first area having a conductive member formed from the top surface to the bottom surface; and
a second area having a conductive member formed from the top surface to a first position and a non-conductive member formed from the first position to the bottom surface, and
wherein the inner sidewall includes:
a third area having a conductive member formed from the top surface to the bottom surface; and
a fourth area having a conductive member formed from the top surface to a second position and a non-conductive member formed from the second position to the bottom surface.

12. The electronic device of claim 11, wherein the interposer structure further includes a plurality of conductive vias penetrating the interposer from the top surface to the bottom surface, and
the plurality of conductive vias include a first conductive via disposed at a position corresponding to the first area and a second conductive via corresponding to the second area.

13. The electronic device of claim 12, wherein the second conductive via is electrically connected to a signal contact one of the one or more electronic components mounted on the first circuit board and electrically connected to a signal contact on the second circuit board, and disposed to closer to the outer sidewall than the inner sidewall at a position corresponding to the second area.

14. The electronic device of claim 11, wherein the first position is spaced apart from each of the top surface and the bottom surface.

15. The electronic device of claim 14, wherein a ratio of a distance from the bottom surface to the first position to a distance between the top surface and the bottom surface is between 0.5 and 1.

16. The electronic device of claim 11, wherein a ratio of a distance from the bottom surface to the second position to a distance between the top surface and the bottom surface is greater than 0.5 and smaller than 1.

17. The electronic device of claim 11, wherein the one or more electronic components mounted on the first circuit board and the one or more electronic components mounted on the second circuit board include at least one of a processor, memory, or a communication circuit.

18. The electronic device of claim 12, wherein the first conductive via is electrically connected to a ground contact one of the one or more electronic components mounted on the first circuit board and electrically connected to a ground contact on the second circuit board.

* * * * *